(12) United States Patent
Ejiri et al.

(10) Patent No.: US 6,791,160 B2
(45) Date of Patent: Sep. 14, 2004

(54) SEMICONDUCTOR DEVICE AND PROCESS FOR FABRICATION THEREOF

(75) Inventors: Hirokazu Ejiri, Kanagawa (JP); Shigeru Kanematsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/077,627

(22) Filed: Feb. 14, 2002

(65) Prior Publication Data

US 2002/0123178 A1 Sep. 5, 2002

(30) Foreign Application Priority Data

Feb. 19, 2001 (JP) ..................................... P2001-041790

(51) Int. Cl.[7] .......................... H01L 29/70; H01L 29/00
(52) U.S. Cl. ..................... 257/577; 257/535; 257/532; 257/458; 257/83
(58) Field of Search ............................... 257/532, 517, 257/577, 458, 83, 535

(56) References Cited

U.S. PATENT DOCUMENTS

| | | | | |
|---|---|---|---|---|
| 5,406,447 A | * | 4/1995 | Miyazaki | 257/535 |
| 5,410,175 A | * | 4/1995 | Kyomasu et al. | 257/458 |
| 6,156,594 A | * | 12/2000 | Gris | 438/202 |
| 6,204,524 B1 | * | 3/2001 | Rhodes | 257/222 |
| 6,433,366 B1 | * | 8/2002 | Takimoto et al. | 257/83 |

* cited by examiner

Primary Examiner—Michael Trinh
(74) Attorney, Agent, or Firm—Sonnenschein, Nath & Rosenthal LLP (57) ABSTRACT

Disclosed is a semiconductor device in which the capacitive element of MIMC structure has a low parasitic capacity. A process for fabrication of said semiconductor device. The semiconductor device has a capacitive element of MIMC structure, a PN photodiode, and a vertical NPN bipolar transistor which are mounted together on the same semiconductor substrate. The lower wiring layer connected to the TiN lower electrode layer of the capacitive element of MIMC structure is formed on the insulating film and the first interlayer insulating film. Between this insulating film and the p-type semiconductor substrate is the p$^-$-type low-concentration semiconductor layer whose impurity concentration is lower than that of the p-type semiconductor substrate. This construction suppresses the parasitic capacity of the capacitive element of the MIMC structure. Thus, it is possible to realize a multi-functional high-performance integrated circuit in which the capacitive element of MIMC structure with a low parasitic capacity, the photodiode, and the bipolar transistor are mounted together on the same semiconductor substrate.

7 Claims, 8 Drawing Sheets

SEMICONDUCTOR DEVICE AND PROCESS FOR FABRICATION THEREOF

RELATED APPLICATION DATA

The present application claims priority to Japanese Application(s) No(s) P2001-041790 filed Feb. 19, 2001, which application(s) is/are incorporated herein by reference to the extent permitted by law.

BACKGROUND OF THE INVENTION

The present invention relates to a semiconductor device and a process for fabrication thereof. More particularly, the present invention relates to a semiconductor device having a capacitive element of MIMC structure and a process for fabrication thereof.

There are two types of conventional capacitive elements formed on the semiconductor substrate (such as silicon substrate). One is of MIS capacitor structure which is characterized in that a low-resistance diffused layer formed in the semiconductor substrate functions as the lower electrode layer. Another is of MIMC structure which is characterized in that a conductive layer formed on an insulating film on the semiconductor substrate functions as the lower electrode layer. Conventional capacitive elements of MIS capacitor structure and MIMC structure are briefly explained in the following with reference to FIG. 11 and FIG. 12, respectively.

Figure 11:
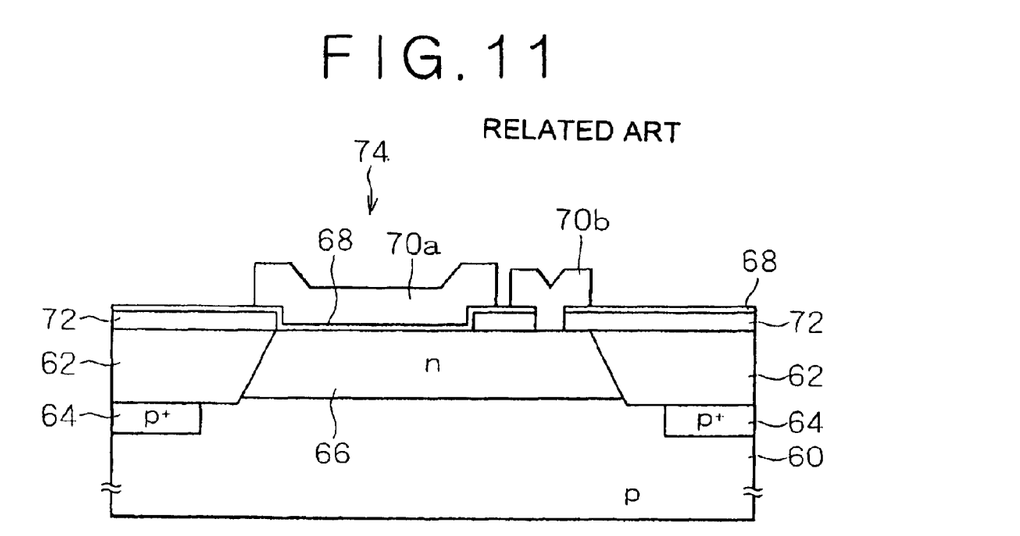
FIG. 11 is a schematic sectional view showing the conventional capacitive element of MIS capacitor structure.

A conventional capacitive element of MIS capacitor structure is shown in FIG. 11. It has a p-type semiconductor substrate 60, a field oxide film 62 on the surface of the substrate, and an element region isolated by a $p^+$-type element isolating region 64 under the field oxide film. In the element region is an n-type impurity diffused layer 66 which functions as the lower electrode. On the n-type impurity diffused layer 66 (which functions as the lower electrode) is formed a first upper wiring layer 70a (which functions as the upper electrode), with a SiN dielectric layer 68 interposed between them. A second upper wiring layer 70b is formed which is connected to the n-type impurity diffused layer 66 (which functions as the lower electrode) through a via hole made in an interlayer insulating film 72 and the SiN dielectric layer 68. Thus, the capacitive element 74 of MIS capacitor structure is constructed such that the SiN dielectric layer 68 is held between the n-type impurity diffused layer 66 (which functions as the lower electrode) and the first upper wiring layer 70a (which functions as the upper electrode). There exists a parasitic capacity between the capacitive element 74 of MIS capacitor structure and the p-type semiconductor substrate 60. This parasitic capacity is dominated by the PN junction capacity between the n-type impurity diffused layer 66 (which functions as the lower electrode) and the p-type semiconductor substrate 60.

Figure 12:
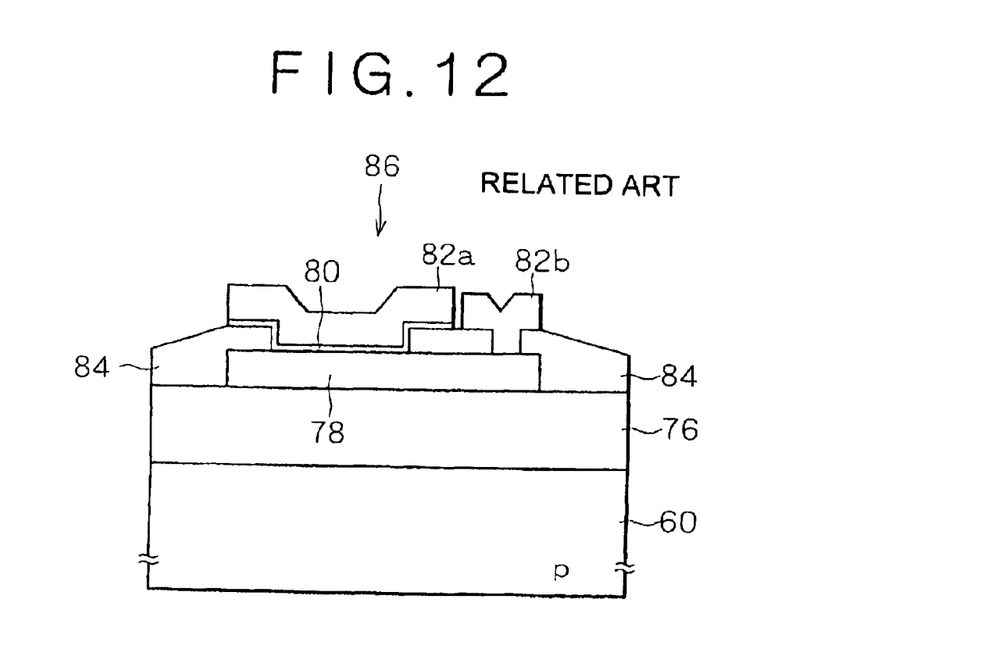
FIG. 12 is a schematic sectional view showing the conventional capacitive element of MIMC structure.

A conventional capacitive element of MIMC structure is shown in FIG. 12. It has a p-type semiconductor substrate 60 and a lower wiring layer 78 (which functions as the lower electrode), with an insulating film 76 interposed between them. On the lower wiring layer 78 (which functions as the lower electrode) is formed a first upper wiring layer 82a, with a SiN dielectric layer 80 interposed between them. A second upper wiring layer 82b is formed which is connected to the lower wiring layer 78 (which functions as the lower electrode) through a via hole made in an interlayer insulating film 84.

Thus, the capacitive element 86 of MIMC structure is constructed such that the SiN dielectric layer 80 is held between the lower wiring layer 78 (which functions as the lower electrode) and the first upper wiring layer 82a (which functions as the upper electrode). There exists a parasitic capacity between the capacitive element 86 of MIMC structure and the p-type semiconductor substrate 60. This parasitic capacity is dominated by the capacity between the lower wiring layer 78 (which functions as the lower electrode) and the p-type semiconductor substrate 60.

On account of their construction mentioned above, there is a difference in parasitic capacity between the conventional capacitive element 74 of MIS capacitor structure and the conventional capacitive element 86 of MIMC structure. Usually, the latter permits its parasitic capacity to be reduced more easily than the former, because the insulating film 76 is thick. In addition, the latter is particularly suitable for high-frequency applications. Therefore, the capacitive element of MIMC structure is usually employed if it is necessary for the capacitive element to have a high capacity, a low parasitic capacity, and a low parasitic resistance.

Although the conventional capacitive element of MIMC structure has a smaller parasitic capacity as compared with that of MIS capacitor structure, it cannot be freed of its parasitic capacity completely because there exists a semiconductor substrate under the capacitive element, with an insulating film interposed between them. In order to realize a high-performance capacitive element with a low parasitic capacity, it is necessary to reduce further the parasitic capacity of the capacitive element of MIMC structure.

One way to meet this requirement is to employ an SOI (Silicon On Insulator) substrate having an insulating film. The use of this substrate greatly helps to reduce parasitic capacity. Unfortunately, this substrate suffers the disadvantage of complicating the steps for fabrication of integrated circuits, which is economically unjustifiable.

There is another way of reducing parasitic capacity by making thicker the interlayer insulating film between the semiconductor substrate and the capacitive element of MIMC structure. The disadvantage of this way is a necessity to form a deeply stepped electrode for connection of wires in multi-layer structure. Connection in this manner tends to cause incomplete contact.

SUMMARY OF THE INVENTION

The present invention was completed in view of the foregoing. It is an object of the present invention to provide a semiconductor device in which the capacitive element of MIMC structure has a reduced parasitic capacity. It is another object of the present invention to provide a process for fabrication of the semiconductor device.

The above-mentioned objects are achieved by the semiconductor device and the process for fabrication thereof as set forth in the appended claims.

The first aspect of the present invention is directed to a semiconductor device which has a capacitive element on an insulating film formed on a semiconductor substrate, the capacitive element including a lower electrode layer, a dielectric layer, and an upper electrode layer, wherein a semiconductor layer of prescribed conductivity type having a lower impurity concentration than the semiconductor substrate, is formed between the semiconductor substrate and the insulating film.

The semiconductor device defined in the first aspect of the present invention includes the capacitive element of MIMC structure (or the capacitive element in which a lower electrode layer, a dielectric layer, and an upper electrode layer are sequentially laminated on an insulating film) has a semiconductor layer of prescribed conductivity type with a lower impurity concentration than the semiconductor substrate which is interposed between the lower insulating film and the semiconductor substrate. This construction reduces the parasitic capacity of the capacitive element of MIMC structure.

In addition, this construction makes it unnecessary to use an SOI substrate which complicates fabrication of integrated circuits and to use a high-resistance semiconductor substrate which is difficult to produce. This avoids cost increase and latch-up due to parasitic elements. This construction does not need an unduly thick insulating film which is interposed between the semiconductor substrate and the capacitive element of MIMC structure. This avoids defective contact of wiring between layers of multi-layer wiring structure.

The second aspect of the present invention is directed to a semiconductor device in which a capacitive element and a photodiode are mounted together on the same semiconductor substrate. This semiconductor device includes: a semiconductor layer of prescribed conductivity type with a lower impurity concentration than the semiconductor substrate is formed on the semiconductor substrate; a low-concentration semiconductor layer of the semiconductor layer of prescribed conductivity type and a semiconductor layer which becomes either an anode or cathode are formed respectively in the capacitive element forming region and the photodiode forming region; and a capacitive element consisting of a lower electrode layer, a dielectric layer, and an upper electrode layer which are sequentially laminated on the low-concentration semiconductor substrate, with an insulating film interposed between them, wherein a semiconductor layer which becomes an anode or cathode of semiconductor layer having a conductivity type opposite to the semiconductor layer of prescribed conductivity type is formed on the semiconductor layer which becomes either an anode or a cathode.

"The semiconductor layer which becomes either an anode or a cathode of photodiode" means the semiconductor layer which becomes the cathode of the photodiode when the semiconductor layer which becomes, for instance, the anode of the photodiode by the semiconductor layer of prescribed conductivity type, or the semiconductor layer which becomes the anode of the photodiode when the semiconductor layer which becomes, for instance, the cathode of the photodiode by the semiconductor layer of prescribed conductivity type. This definition is applied hereinafter.

The semiconductor device pertaining to the second aspect of the present invention, in which a capacitive element and a photodiode are mounted together on the same substrate includes a semiconductor layer with a lower impurity concentration than the semiconductor substrate is formed on the substrate in the capacitive element region, and a capacitive element consisting of a lower electrode layer, a dielectric layer, and an upper electrode layer which are sequentially laminated is formed on the low-concentration semiconductor layer, with an insulating film interposed between them. In other words, the capacitive element of MIMC structure is constructed such that a low-concentration semiconductor layer is interposed between the semiconductor substrate and the lower insulating film. This construction suppresses the parasitic capacity of the capacitive element of MIMC structure.

The semiconductor device is constructed such that the low-concentration semiconductor layer under the capacitive element of MIMC structure and the semiconductor layer which becomes either the anode or cathode of the photodiode is the semiconductor layer of prescribed conductivity type formed on the semiconductor substrate. This construction permits the steps to be carried out in common for fabrication of the semiconductor device in which the capacitive element and the photodiode are mounted together on the same semiconductor substrate. This leads to cost reduction.

The third aspect of the present invention is directed to a semiconductor device in which a capacitive element, a photodiode, and a bipolar transistor are mounted all together on the same semiconductor substrate, the semiconductor device includes a semiconductor layer of prescribed conductivity type having a lower impurity concentration than the substrate is formed on the substrate; a low-concentration semiconductor layer of this semiconductor layer of prescribed conductivity type, a semiconductor layer which becomes either an anode or cathode, and a semiconductor layer for substrate are formed in the photodiode forming region and the bipolar transistor forming region; a capacitive element consisting of a lower electrode layer, a dielectric layer, and an upper electrode layer sequentially laminated is formed on the low-concentration semiconductor layer, with an insulating film interposed between them; and a semiconductor layer of prescribed conductivity type and a semiconductor layer of opposite conductivity type are formed on the semiconductor layer which becomes either an anode or cathode; wherein the semiconductor layer for substrate, and a semiconductor layer which becomes the other of either an anode or cathode of the semiconductor layer of opposite conductivity type and a collector layer are formed.

Incidentally, the term "semiconductor layer substrate" means any semiconductor layer which functions as an ordinary substrate for a bipolar transistor. This definition is applicable throughout the description that follows.

The semiconductor device pertaining to the third aspect of the present invention has a capacitive element, a photodiode, and a bipolar transistor which are mounted all together on the same semiconductor substrate, such that a semiconductor layer having a lower impurity concentration than the substrate is formed on the substrate in the capacitive element forming region, and a capacitive element including a lower electrode layer, a dielectric layer, and an upper electrode layer sequentially laminated is formed on the low-concentration semiconductor layer, with an insulating film interposed between them. In other words, a low-concentration semiconductor layer is interposed between the semiconductor substrate and the insulating film under the capacitive element of MIMC structure. As in the case of the first aspect mentioned above, this construction suppresses the parasitic capacity of the capacitive element of MIMC structure.

In addition, the low-concentration semiconductor layer under the capacitive element of MIMC structure, the semiconductor layer which becomes either the anode or cathode of the phototransistor, and the semiconductor layer for substrate of the bipolar transistor are formed from the semiconductor layer of prescribed conductivity type which is formed on the semiconductor substrate. And the semiconductor layer which becomes either the anode or cathode of the photodiode and the collector layer of the bipolar transistor are formed from the semiconductor layer of opposite conductivity type formed on the semiconductor layer of prescribed conductivity type. This construction permits the steps to be carried out in common for fabrication of the semiconductor device in which the capacitive element, the photodiode, and the bipolar transistor are mounted together on the same semiconductor substrate. This leads to cost reduction.

Preferably, the fourth aspect of the present invention is concerned with the semiconductor device defined in any of the first to third aspects mentioned above, in which the lower electrode layer of the capacitive element is formed from TiN.

Preferably, the fifth aspect of the present invention is concerned with the semiconductor device defined in any of the first to third aspects mentioned above, in which the dielectric layer of the capacitive element is formed from $Ta_2O_5$.

Preferably, the sixth aspect of the present invention is concerned with the semiconductor device defined in any of the first to third aspects mentioned above, in which the upper electrode layer of the capacitive element is formed from TiN.

Preferably, the seventh aspect of the present invention is concerned with the semiconductor device defined in any of the first to third aspects mentioned above, in which the impurity concentration of the semiconductor layer of prescribed conductivity type is no lower than $1\times10^{13}$ cm$^{-3}$ and no higher than $5\times10^{14}$ cm$^{-3}$.

Preferably, the eighth aspect of the present invention is concerned with the semiconductor device defined in any of the first to third aspects mentioned above, in which the semiconductor layer of prescribed conductivity type has an impurity concentration no lower than $1\times10^{13}$ cm$^{-3}$ and no higher than $5\times10^{14}$ cm$^{-3}$ and the semiconductor layer whose conductivity type is opposite to that of the semiconductor layer of prescribed conductivity type has an impurity concentration no lower than $1\times10^{15}$ cm$^{-3}$ and no higher than $5\times10^{16}$ cm$^{-3}$.

The ninth aspect of the present invention is directed to a process for fabrication of a semiconductor device, the process includes the steps of: a first step of forming on a semiconductor substrate a semiconductor layer having a lower impurity concentration than the semiconductor substrate; a second step of forming an insulating film on the semiconductor layer; and a third step of forming on the semiconductor layer a capacitive element by sequentially laminating a lower electrode layer, a dielectric layer, and an upper electrode layer.

The process for fabrication of a semiconductor device according to the ninth aspect of the present invention includes the steps of: a first step of forming on a semiconductor substrate a semiconductor layer having a lower impurity concentration than the semiconductor substrate; a second step of forming an insulating film on the semiconductor layer; and a third step of forming on the semiconductor layer a capacitive element by sequentially laminating a lower electrode layer, a dielectric layer, and an upper electrode layer. In other words, when the capacitive element of MIMC structure is formed, a semiconductor layer of prescribed conductivity type having a lower impurity concentration than the semiconductor substrate is formed between the semiconductor substrate and the insulating film thereunder. This construction suppresses the parasitic capacity of the capacitive element of MIMC structure.

The tenth aspect of the present invention is directed to a process for fabrication of a semiconductor device in which a capacitive element and a photodiode are mounted together on the same substrate, the process includes the steps of: a first step of forming on a semiconductor substrate a semiconductor layer of a first conductivity type having a lower impurity concentration than the semiconductor substrate, thereby forming a low-concentration semiconductor layer in the capacitive element forming region and a semiconductor layer which becomes either the anode or cathode in the photodiode forming region; a second step of forming on the semiconductor layer of a first conductivity type a semiconductor layer of a second conductivity type, thereby forming a semiconductor layer which becomes either the anode or cathode in the photodiode forming region; a third step of performing selective oxidation on the semiconductor layer of a second conductivity in the capacitive element forming region, thereby forming an insulating film on the semiconductor layer of a first conductivity type, and a fourth step of forming on the insulating film a capacitive element by sequentially laminating a lower electrode layer, a dielectric layer, and an upper electrode layer.

The process for fabrication of a semiconductor device according to the tenth aspect of the present invention includes a semiconductor layer of a first conductivity type having a lower impurity concentration than the semiconductor substrate formed on a semiconductor substrate, thereby forming a low-concentration semiconductor layer, forming on the semiconductor layer of a first conductivity type a semiconductor layer of a second conductivity type, forming an insulating layer by selective oxidation, forming on the insulating layer a capacitive element by sequentially laminating a lower electrode layer, a dielectric layer, and an upper electrode layer. In other words, when the capacitive element of MIMC structure is formed, a low-concentration semiconductor layer is formed between the semiconductor substrate and the insulating film thereunder. This construction suppresses the parasitic capacity of the capacitive element of MIMC structure as in the case of the ninth aspect mentioned above.

According to this process, the low-concentration semiconductor layer under the capacitive element of MIMC structure and the semiconductor layer which becomes either the anode or cathode of the photodiode are formed simultaneously by formation of the semiconductor layer of a first conductivity type on the semiconductor substrate. This construction permits the steps to be carried out in common for fabrication of the semiconductor device in which the capacitive element and the photodiode are mounted together on the same semiconductor substrate. This leads to cost reduction.

The eleventh aspect of the present invention is directed to a process for fabrication of a semiconductor device in which a capacitive element, a photodiode, and a bipolar transistor are mounted together on the same substrate, the process includes the steps of: a first step of forming on a semiconductor substrate a semiconductor layer of a first conductivity type having a lower impurity concentration than the semiconductor substrate, thereby forming a low-concentration semiconductor layer in the capacitive element forming region and forming a semiconductor layer which becomes either the anode or cathode in the photodiode; a second step of forming on the semiconductor layer of a first conductivity type a semiconductor layer of a second conductivity type, thereby forming a semiconductor layer which becomes either the anode or cathode in the photodiode forming region and a collector layer in the bipolar transistor forming region; a third step of performing selective oxidation on the semiconductor layer of a second conductivity in the capacitive element forming region, thereby forming an insulating film on the semiconductor layer of a first conductivity type; and a fourth step of forming on the insulating film a capacitive element by sequentially laminating a lower electrode layer, a dielectric layer, and an upper electrode layer.

The process for fabrication of a semiconductor device according to the eleventh aspect of the present invention includes a semiconductor layer of a first conductivity type having a lower impurity concentration than the semiconductor substrate formed on a semiconductor substrate, thereby forming a low-concentration semiconductor layer, and performing selective oxidation on the semiconductor layer of a second conductivity formed on the semiconductor layer of a first conductivity type, thereby forming an insulating film, and forming on this insulating film a capacitive element by sequentially laminating a lower electrode layer, a dielectric layer, and an upper electrode layer. In other words, when the capacitive element of MIMC structure is formed, a low-concentration semiconductor layer is formed between the semiconductor substrate and the insulating film thereunder. This construction suppresses the parasitic capacity of the capacitive element of MIMC structure as in the case of the ninth aspect mentioned above.

According to this process, the low-concentration semiconductor layer under the capacitive element of MIMC structure, the semiconductor layer which becomes either the anode or cathode of the photodiode, and the semiconductor layer for substrate of the bipolar transistor are formed simultaneously by formation of the semiconductor layer of a first conductivity type on the semiconductor substrate, and the semiconductor layer which becomes either the anode or cathode of the photodiode and the collector layer of the bipolar transistor are formed simultaneously by formation of the semiconductor layer of a second conductivity type on the semiconductor layer of a first conductivity type. This construction permits the steps to be carried out in common for fabrication of the semiconductor device in which the capacitive element, the photodiode, and the bipolar transistor are mounted together on the same semiconductor substrate. This leads to cost reduction.

Preferably, the twelfth aspect of the present invention is concerned with a modification of the process for fabrication of a semiconductor device defined in the tenth or eleventh aspect mentioned above, the modification being characterized in that when the semiconductor layer of a second conductivity type in the capacitive element forming region is selectively oxidized and the insulating film is formed on the semiconductor layer of a first conductivity type, the semiconductor layer of a second conductivity type in the element isolating part is also selectively oxidized at the same time, thereby the field oxide film is formed.

In this case, the insulating film under the capacitive element of MIMC structure and the field oxide film in the element isolating part are formed simultaneously by selective oxidation of the semiconductor layer of a second conductivity type. This construction permits the steps to be carried out in common for fabrication of the semiconductor device in which the capacitive element etc. are mounted together on the same semiconductor substrate. This leads to further cost reduction.

Preferably, the thirteenth aspect of the present invention is concerned with a modification of the process for fabrication of a semiconductor device defined in the eleventh aspect mentioned above, the modification includes an additional step of incorporating an impurity of prescribed conductivity type into the semiconductor layer for substrate after the semiconductor layer of a first conductivity type having a lower impurity concentration lower than the substrate is formed on the semiconductor substrate, thereby a low-concentration semiconductor layer is formed in the capacitive element forming region and the semiconductor layer for substrate is formed in the bipolar transistor forming region.

In this case, it is possible to control the impurity concentration in the semiconductor layer for substrate which functions as the substrate of the bipolar transistor, for matching with the impurity concentration of the substrate required to realize the desired characteristics. In this way the bipolar transistor having the desired characteristics is fabricated.

DESCRIPTION OF THE PREFERRED EMBODIMENTS

The preferred embodiments of the present invention will be described with reference to the accompanying drawings.

Figure 1:
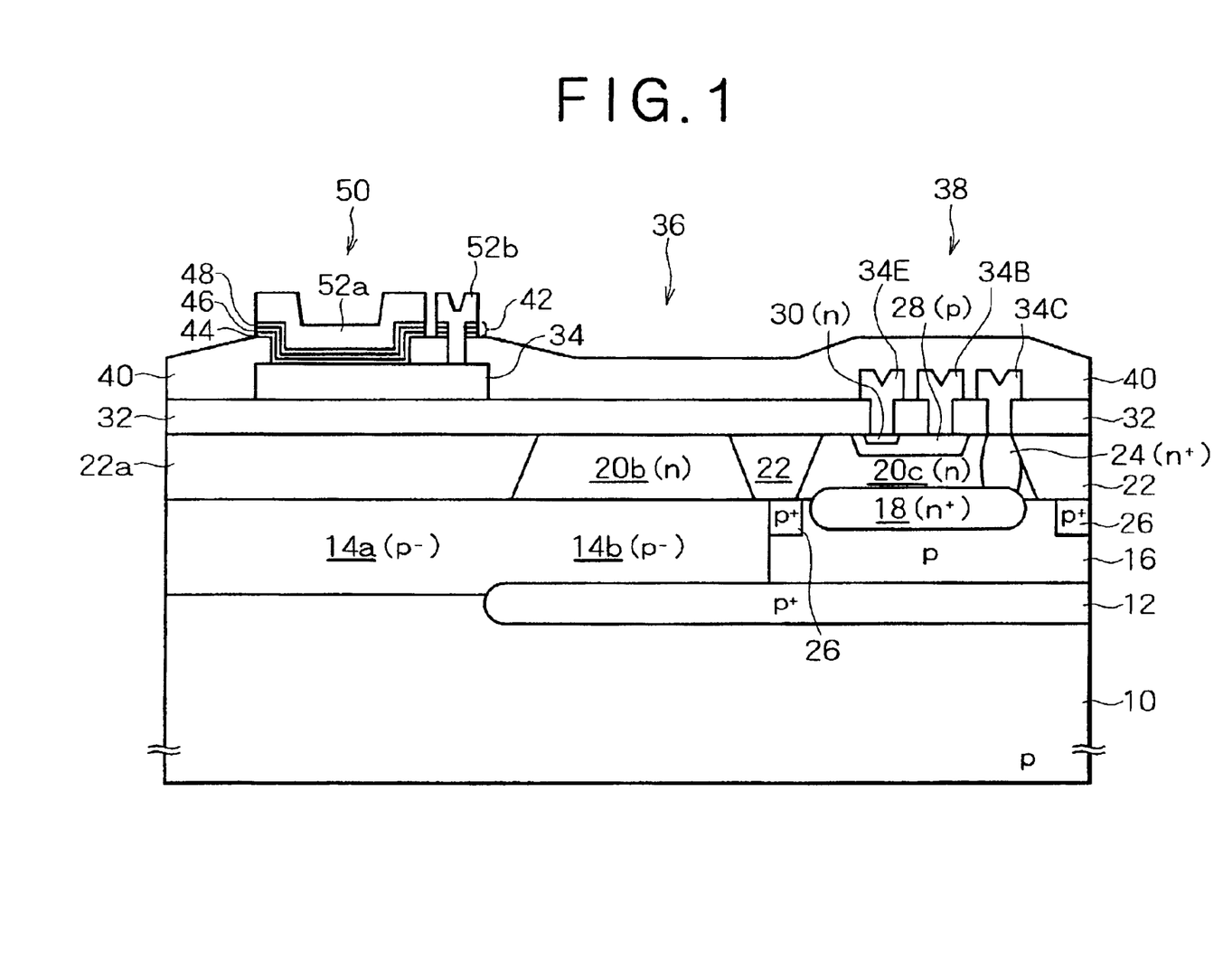
FIG. 1 is a schematic sectional view showing a semiconductor device pertaining to one embodiment of the present invention, said semiconductor device having a capacitive element of MIMC structure, a PN photodiode, and a vertical NPN bipolar transistor, which are mounted all together on the same semiconductor substrate.

FIG. 1 is a schematic sectional view showing a semiconductor device pertaining to one embodiment of the present invention, said semiconductor device having a capacitive element of MIMC structure, a PN photodiode, and a vertical NPN bipolar transistor, which are mounted all together on the same semiconductor substrate. FIGS. 2 to 7 are sectional views, each illustrating the step of fabricating the semiconductor device shown in FIG. 1.

In FIG. 1, there are shown a capacitive element 50 of MIMC structure, a PN photodiode 36, and a vertical NPN bipolar transistor 38. There is also shown a p-type semiconductor substrate 10 having an impurity concentration of about $1 \times 10^{15}$ cm$^{-3}$. All of the foregoing elements are mounted on this substrate.

The capacitive element 50 of MIMC structure consists of an upper electrode layer 48 of TiN (about 10–50 nm thick) and a lower electrode layer 44 of TiN (about 10–200 nm thick), which are placed one over the other, with a dielectric layer 46 of $Ta_2O_5$ (about 10–70 nm thick) interposed between them. To the upper electrode layer 48 of TiN is connected a first upper wiring layer 52a, and to the lower electrode layer 44 of TiN are connected a lower wiring layer 34 and a second upper wiring layer 52b through a via hole.

The lower wiring layer 34 (which is in contact with the lower electrode layer 44 of TiN under the capacitive element 50 of MIMC structure) is formed on a first interlayer insulating film 32 of silicon oxide and an insulating film 22a (about 400–1500 nm thick). Between the insulating film 22a and the p-type semiconductor substrate 10 is a p⁻-type semiconductor layer 14a (about 10 μm thick) which has an impurity concentration of about $2 \times 10^{14}$ cm$^{-3}$ (which is lower than that of the p-type semiconductor substrate 10). The foregoing structure is the feature of this embodiment.

The PN photodiode 36 has the PN junction consisting of a p⁻-type anode layer 14b and an n-type cathode layer 20b, the former having an impurity concentration of about $2 \times 10^{14}$ cm$^{-3}$ and the latter having an impurity concentration of about $5 \times 10^{15}$ cm$^{-3}$. The p type anode layer 14b is formed on the p-type semiconductor substrate 10, with a p⁺-type semiconductor region 12 interposed between them. To the p⁻-type anode layer 14b is connected an anode electrode (not shown) through a p⁺-type anode lead-out region (not shown). To the n-type cathode layer 20b is connected a cathode electrode (not shown) through an n⁺-type cathode lead-out region (not shown).

The p⁻-type anode layer 14b of the PN photodiode 36 is a p⁻-type epitaxial layer which is formed simultaneously together with the p⁻-type semiconductor layer 14a (with a low impurity concentration) in the capacitive element 50 of MIMC structure, on the p-type semiconductor substrate 10 and the p⁺-type semiconductor region 12. The foregoing structure is the feature of this embodiment.

The vertical NPN bipolar transistor 38 is formed on a semiconductor layer 16 as a p-type substrate which has an impurity concentration of about $1 \times 10^{15}$ cm$^{-3}$ in the vicinity of the surface. The semiconductor layer 16 is formed on the p-type semiconductor substrate 10, with a p⁺-type semiconductor region 12 interposed between them. The vertical NPN bipolar transistor 38 is composed of an n-type collector layer 20c, a p-type base region 28, and an n⁺-type emitter region 34E. (The n-type collector layer 20c is formed on the semiconductor layer 16 as a p-type substrate, with a n⁺-type collector buried layer 18 interposed between them. The p-type base region 28 is formed on the surface of the n-type collector layer 20c. The n⁺-type emitter region 34E is formed on the surface of the p-type base region 28.) To the n-type emitter region 30 is connected an emitter electrode 34E. To the p-type base region 28 is connected a base electrode 34B through a p⁺-type base lead-out region (not shown). To the n-type collector layer 20c is connected a collector electrode 34C through a n⁺-type collector buried layer 18 and an n⁺-type collector lead-out region 24.

In the vertical NPN bipolar transistor 38, the semiconductor layer 16 as a p-type substrate is a p⁻-type epitaxial layer to which a p-type impurity (such as boron) has been selectively added. The p⁻-type epitaxial layer is one of which has been grown to form the p⁻-type lightly doped semiconductor layer 14a for the capacitive element 50 of MIMC structure and also to form the p⁻-type anode layer 14b for the PN photodiode. Moreover, in the vertical NPN bipolar transistor 38, the n-type collector layer 20c is an n-type epitaxial layer which has been formed on the p⁻-type epitaxial layer 14 and the semiconductor layer 16 as a p-type substrate, simultaneously and together with the n-type cathode layer 20b of the PN photodiode 36. The foregoing structure is the feature of this embodiment.

The PN photodiode 36 and the vertical NPN bipolar transistor 38 are basically of conventional structure; however, they may be of any structure so long as they have the above-mentioned feature. The present invention is not restricted by the structure.

An explanation is made below, with reference to FIGS. 2 to 8, of the process for fabricating the semiconductor device shown in FIG. 1, in which the capacitive element 50 of MIMC structure, the PN photodiode, and the vertical NPN bipolar transistor 38 are mounted all together on the same p-type semiconductor substrate 10.

In FIGS. 2 to 8, which are sectional views showing the process for fabrication, the regions for the capacitive element 50, the PN photodiode 36, and the vertical NPN bipolar transistor 38, which are formed on the p-type semiconductor substrate 10, are referred to as the capacitive element forming region A, the photodiode forming region B, and the bipolar transistor forming region C, respectively.

Figure 2:
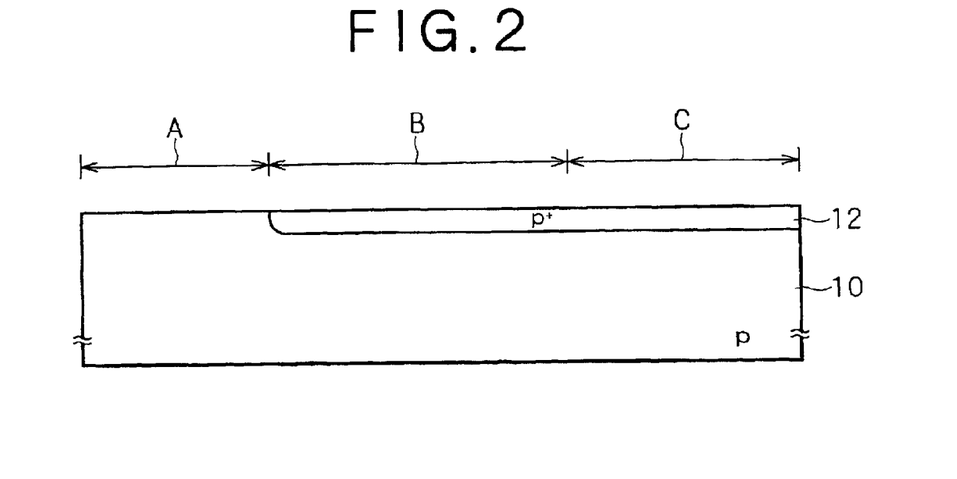
FIG. 2 is a sectional view (part 1) illustrating the process for fabrication of the semiconductor device shown in FIG. 1.

The process starts with forming a thin thermal oxide film on the surface of the p-type semiconductor substrate 10 which has an impurity concentration of about $1 \times 10^{15}$ cm$^{-3}$. The semiconductor substrate undergoes selective ion implantation with a p-type impurity (such as boron) at an accelerating voltage of 30 keV and a dose of $1 \times 10^{15}$ cm$^{-2}$, through a mask of photolithographically patterned photoresist.

Heat treatment at 1200° C. for about 1 hour is performed so that the p-type impurity ions which have been implanted in high concentrations into the surface of the p-type semiconductor substrate 10 become activated and diffuse into the surface of the p-type semiconductor substrate 10, thereby forming a high concentration of p⁺-semiconductor region 12 with about $1 \times 10^{18}$ cm$^{-3}$ (peak concentration). The above-mentioned thermal oxide film is entirely removed by using hydrofluoric acid (HF). See FIG. 2.

Figure 3:
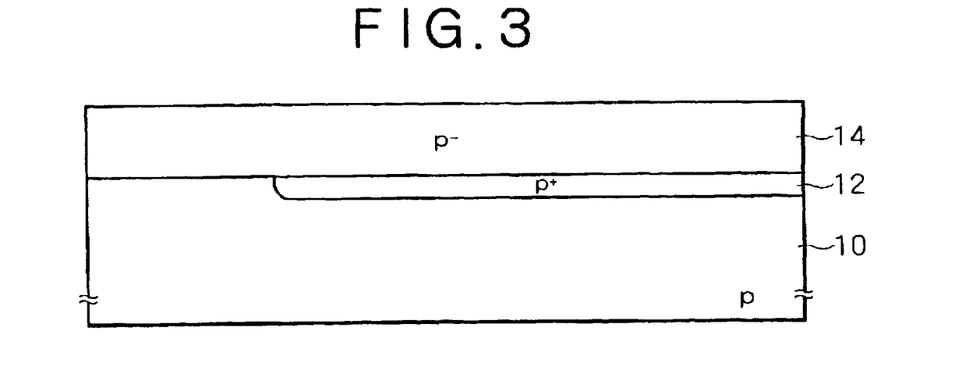
FIG. 3 is a sectional view (part 2) illustrating the process for fabrication of the semiconductor device shown in FIG. 1.

On the p-type semiconductor substrate 10 and the p⁺-type semiconductor region 12 is formed a p⁻-type epitaxial layer 14 with a low impurity concentration of about $2 \times 10^{14}$ cm$^{-3}$.

This p⁻-type epitaxial layer 14 is intended for the low-concentration semiconductor substrate of the capacitive element forming region A and the anode of the photodiode forming region B, which are to be formed thereon later. See FIG. 3.

Figure 4:
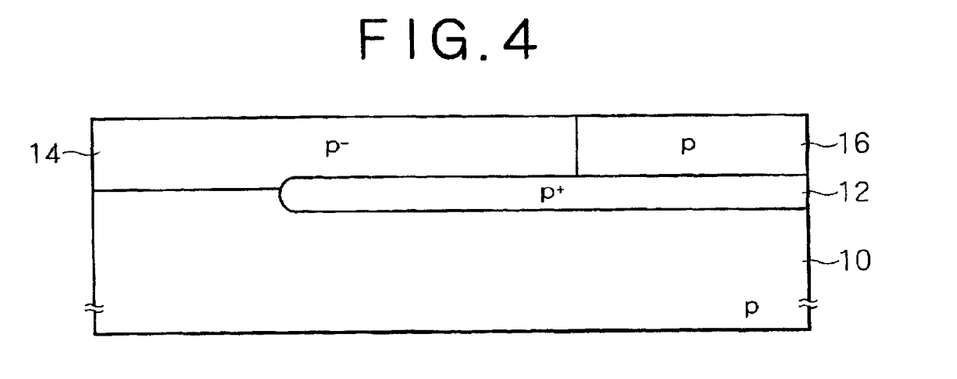
FIG. 4 is a sectional view (part 3) illustrating the process for fabrication of the semiconductor device shown in FIG. 1.

On the surface of the p⁻-type epitaxial layer 14 is formed a thin thermal oxide film. The p⁻-type epitaxial layer 14 (except for the capacitive element forming region A and the photodiode forming region B) undergoes selective ion implantation with a p-type impurity (such as boron) at an accelerating voltage of 500 keV and a dose of $1 \times 10^{12}$ cm$^{-2}$, through a mask of photolithographically patterned photoresist.

Heat treatment at 1200° C. for about 1 hour is performed so that the p-type impurity ions which have been implanted in low concentrations into the p⁻-type epitaxial layer 14 (for the bipolar transistor forming region C) become activated and diffuse, thereby forming a semiconductor layer 16 for p-type substrate with a low impurity concentration of about $1 \times 10^{15}$ cm$^{-3}$ in the vicinity of the surface. The above-mentioned thermal oxide film is entirely removed by using hydrofluoric acid.

This semiconductor layer 16 of p-type substrate is intended for the substrate of the bipolar transistor; therefore, the impurity concentration in the vicinity of its surface is so adjusted as to match with that necessary for the bipolar transistor to exhibit its desired characteristics. In this way it is possible that the bipolar transistor to be formed in the bipolar transistor forming region C has the characteristic properties matching with the impurity concentration. See FIG. 4.

Figure 5:
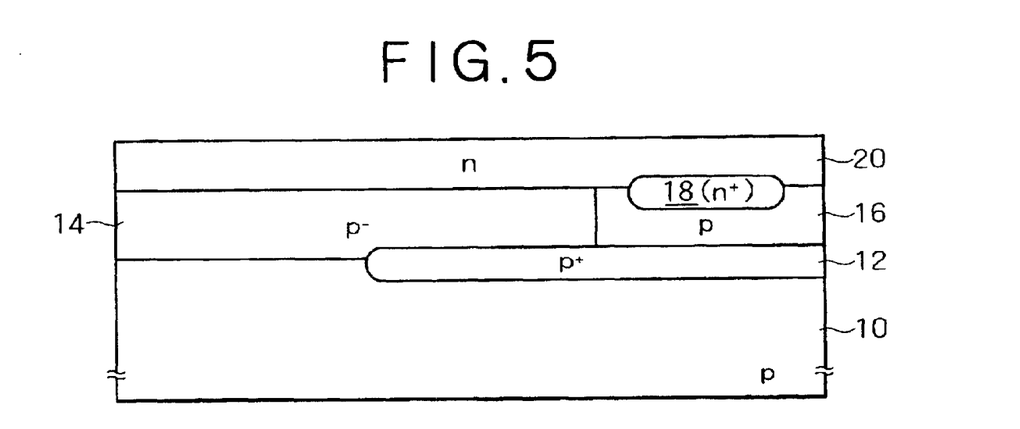
FIG. 5 is a sectional view (part 4) illustrating the process for fabrication of the semiconductor device shown in FIG. 1.

On the surface of the semiconductor layer 16 as a p-type substrate for the bipolar transistor forming region C is formed an n$^+$-type collector buried layer 18 with a high concentration, which is intended to reduce the parasitic resistance of the collector. This step is accomplished by vapor phase diffusion with antimony (Sb) at 1100–1250° C. for 30–60 minutes, so that Sb as an n-type impurity is selectively added.

Incidentally, the heat diffusion treatment in the step shown in FIG. 4 (which forms the semiconductor layer 16 as a p-type substrate) may also serve as the heat diffusion treatment to form the p$^+$-type collector buried layer. In this way it is possible to reduce the number of repetitions of heat diffusion treatment.

On the entire surface of the substrate (or on the p$^-$-type epitaxial layer 14, the semiconductor layer 16 for p-type substrate, and the n$^+$-type collector buried layer 18) is formed an n-type epitaxial layer 20 (1 $\mu$m thick, with an impurity concentration of about $5 \times 10^{15}$ cm$^{-3}$) See FIG. 5.

Figure 6:
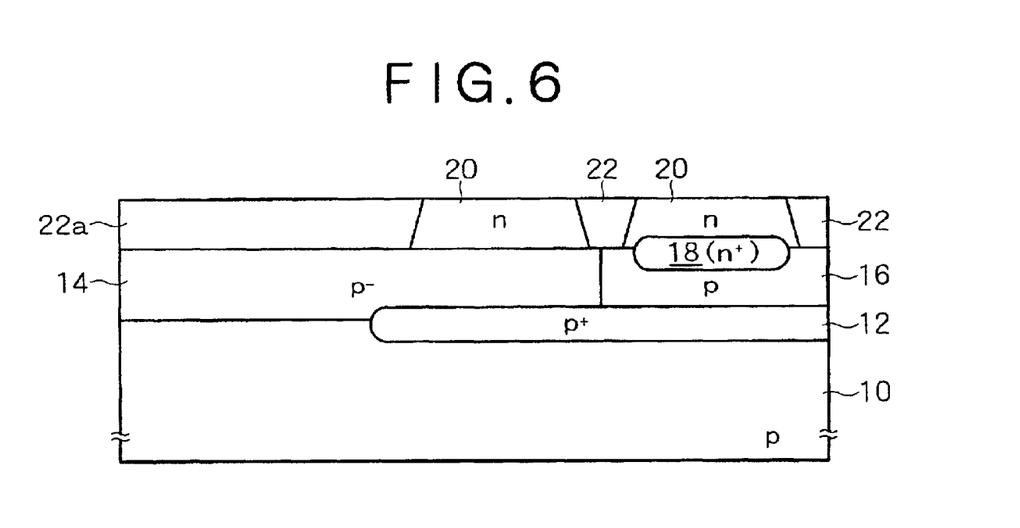
FIG. 6 is a sectional view (part 5) illustrating the process for fabrication of the semiconductor device shown in FIG. 1.

A field oxide film 22 (about 400–1500 nm thick) is selectively formed by LOCOS method (Local Oxidation of Silicon) in the field (element isolation part) for the photodiode forming region B and the bipolar transistor forming region C. At the same time, an insulating film 22a of the same thickness is formed in the capacitive element forming region A.

In other words, on the n-type epitaxial layer 20 is formed a laminate film (consisting of a silicon oxide film and a silicon nitride film) in the usual way. This laminate film undergoes selective etching by RIE (Reactive Ion Etching) through a mask of photolithographically patterned photoresist, so that the region on which the field oxide film and the insulating film are formed is exposed. The exposed n-type epitaxial layer 20 is partly or entirely removed. Then, the n-type epitaxial layer 20 is selectively oxidized by using the silicon nitride film of the laminate film as a mask. In this way the field oxide film 22 and the insulating film 22a, which reach the p$^-$-type epitaxial layer 14 or the semiconductor layer 16 as p-type substrate, are formed.

There is an alternative method, by which the exposed n-type epitaxial layer 20 is not removed before the field oxide film 22 and the insulating film 22a are formed. In this case, the n-type epitaxial layer 20 may remain in the capacitive element forming region A depending on the thickness of the n-type epitaxial layer 20 which undergoes selective oxidation to be carried out subsequently. This method is also within the scope of the present invention.

What is illustrated herein is the case in which the n-type epitaxial layer 20 does not remain between one layer (including the p$^-$-type epitaxial layer 14 and the semiconductor layer 16 as p-type substrate) and the other layer (including the field oxide film 22 and the insulating film 22a). See FIG. 6.

An n$^+$-type collector lead-out region 24, which connects to the n$^+$-type collector buried layer 18 of the bipolar transistor forming region C, is formed by the ordinary process for fabricating bipolar transistors and photodiodes. A p$^+$-type anode lead-out region (not shown), which connects to the p-type epitaxial layer 14 of the photodiode forming region B, is formed. A p$^+$-type element isolating region 26 is formed under the field oxide film 22, for isolation of the photodiode forming region B from the bipolar transistor forming region C.

As the result of element isolation, new terms are assigned hereinafter as follows. The n-type epitaxial layer 20 of the photodiode forming region B is referred to as the n-type cathode layer 20b. The n-type epitaxial layer 20 of the bipolar transistor forming region C is referred to as the n-type collector layer 20c. The p-type epitaxial layer 14 under the insulating film 22a of the capacitive element forming region A is referred to as the p$^-$-type low-concentration semiconductor layer 14a. The p$^-$-type epitaxial layer 14 under the n-type cathode layer 20b of the photodiode forming region B is referred to as the p$^-$-type anode layer 14b.

Figure 7:
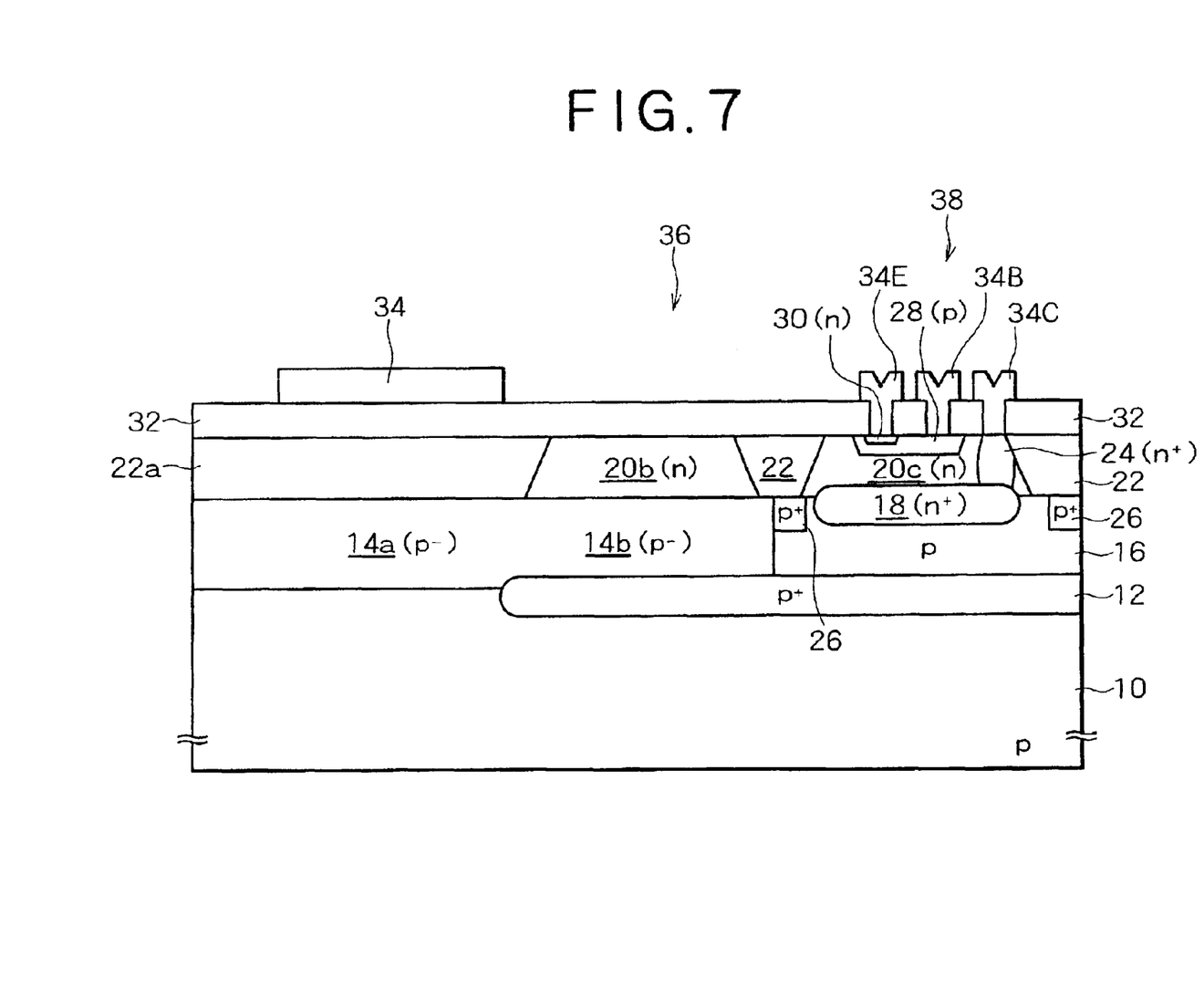
FIG. 7 is a sectional view (part 6) illustrating the process for fabrication of the semiconductor device shown in FIG. 1.

On the surface of the n-type cathode layer 20b of the photodiode forming region B is formed an n$^+$-type cathode lead-out region (not shown). On the surface of the n-type collector layer 20c of the bipolar transistor forming region C is formed a p-type base region 28. On the surface of the p-type base region 28 is formed a p$^-$-type base lead-out region (not shown). On the surface of the p-type base region 28 is formed an n-type emitter region 30.

On the entire surface of the substrate is formed a first interlayer insulating film 32, which may be a silicon oxide film, for instance. Contact holes are formed by photolithography and etching at prescribed positions in the photodiode forming region B and the bipolar transistor forming region C. The contact holes are filled by depositing a metal layer (about 300–1000 nm thick), composed mainly of aluminum alloy, over the entire surface of the substrate. The metal layer is patterned by photolithography and RIE.

In this way, a lower wiring layer 34, which is connected to the lower electrode of the capacitive element to be formed later, is formed on the first interlayer insulating film 32 in the capacitive element forming region A. Likewise, an anode electrode (not shown) and a cathode electrode (not shown), which are connected respectively to the p$^-$-type anode layer 14b and the n-type cathode layer 20b through the p$^+$-type anode lead-out region and the n$^+$-type cathode lead-out region, in the photodiode forming region B.

In the bipolar transistor forming region C are formed an emitter electrode 34E connected to the n-type emitter region 30, a base electrode 34B connected to the p-type base region 28 through the p$^+$-type base lead-out region, and a collector electrode 34C connected to the n-type collector layer 20c through the n$^+$-type collector buried layer 18 and the n$^+$-type collector lead-out region 24. In this way the PN photodiode 36 is completed in the photodiode forming region B, and the vertical NPN bipolar transistor 38 is completed in the bipolar transistor forming region C. See FIG. 7.

Incidentally, in this case, the lower wiring layer 34 in the capacitive element forming region A is formed by the same process simultaneously with the anode electrode and cathode electrode of the PN photodiode 36 and the emitter electrode 34E, base electrode 34B, and collector electrode 34 of the NPN bipolar transistor 38. However, they may be formed separately by separate steps. It is possible as a matter of course to form wiring layers for connection between other elements simultaneously in other regions than the capacitive element forming region A when the lower wiring layer 34 is formed.

Figure 8:
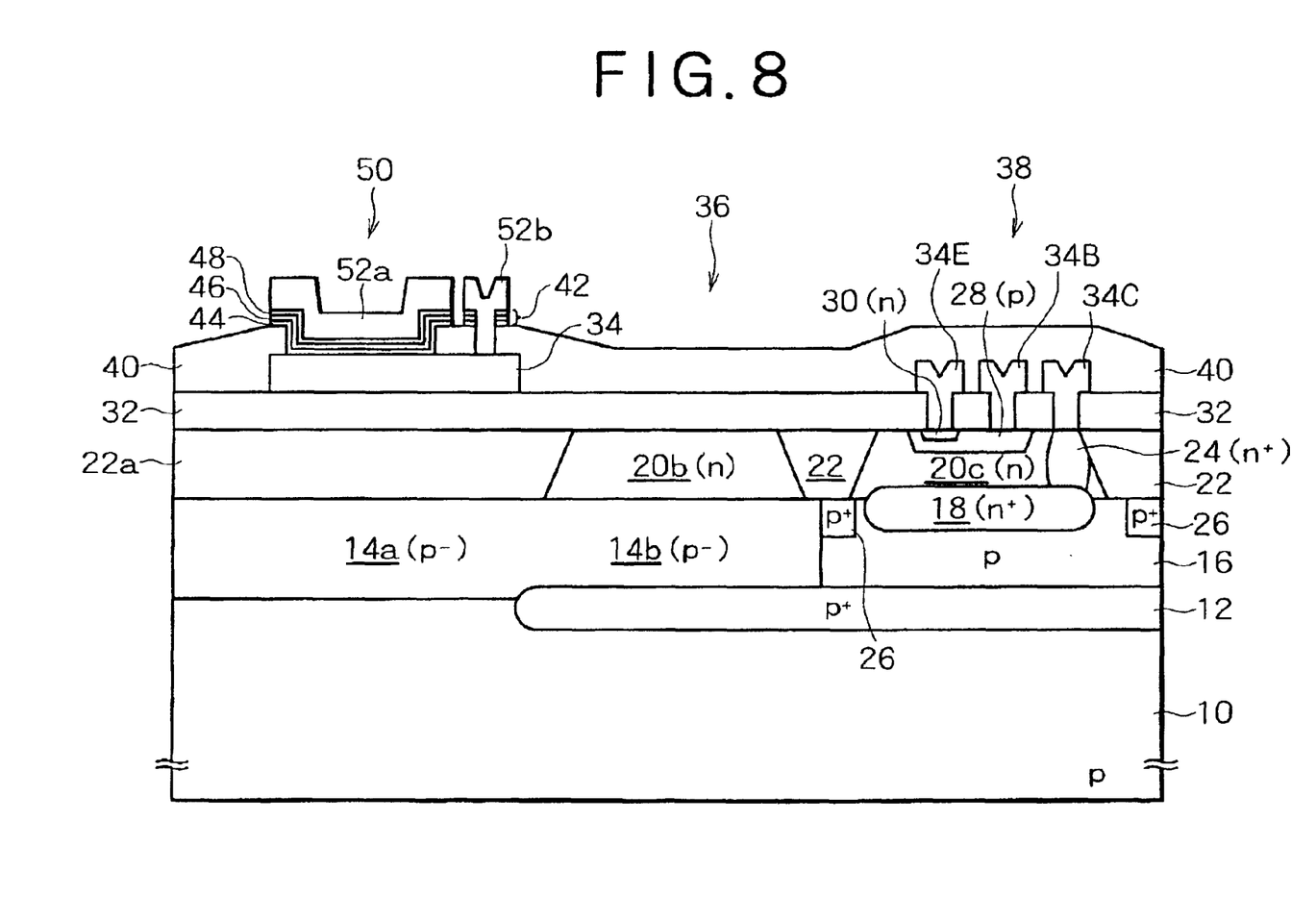
FIG. 8 is a sectional view (part 7) illustrating the process for fabrication of the semiconductor device shown in FIG. 1.

On the entire surface of the substrate is deposited a silicon oxide film by plasma-TEOS method. (TEOS stands for tetraethoxy silane, Si(OC$_2$H$_4$)$_4$). The silicon oxide film is planarized so as to form a second interlayer insulating film 40.

Selective etching by photolithography and RIE is performed on the second interlayer insulating film 40 on the lower wiring layer 34, so that an opening is made through which the surface of the lower wiring layer 34 is exposed. Subsequently, sputtering or CVD (Chemical Vapor Deposition) is performed to deposit a TiN layer (about 10–200 nm thick), which becomes later the lower electrode layer of the capacitive element, over the entire surface of the substrate. On this TiN layer is deposited a $Ta_2O_5$ layer (about 10–70 nm thick) as a dielectric layer. On this $Ta_2O_5$ film is further deposited a TiN layer (about 10–50 nm thick), which becomes the upper electrode layer of the capacitive element. In this way the TiN/$Ta_2O_5$/TiN laminate film 42 is formed. The lowermost TiN layer of the TiN/$Ta_2O_5$/TiN laminate film 42 is connected to the lower wiring layer 34 through the opening.

The TiN/$Ta_2O_5$/TiN laminate film 42 is selectively etched out by photolithography and dry etching. After that, the second interlayer insulating film 40 is selectively etched out so that a via hole reaching the lower wiring layer 34 is made.

On the entire surface of the substrate is deposited a metal layer (about 300–1000 nm thick) composed mainly of aluminum alloy so that the via hole is filled. The metal layer (composed mainly of aluminum alloy) and the TiN/$Ta_2O_5$/TiN laminate film 42 are selectively patterned by photolithography and RIE.

In this way the capacitive element 50 is formed which has the TiN lower electrode layer 44 connected to the lower wiring layer 34, the $Ta_2O_5$ dielectric layer 46 on the TiN lower electrode layer 44, and the TiN upper electrode layer 48 on the $Ta_2O_5$ dielectric layer 46. In other words, the capacitive element 50 of MIMC structure is formed by the $Ta_2O_5$ dielectric layer 46 interposed between the upper TiN electrode layer 48 and the lower TiN electrode layer 44.

At the same time, a first upper wiring layer 52a and a second upper wiring layer 52b are formed, the former being connected to the upper TiN electrode layer 48 of the capacitive element 50 of the MIMC structure, and the latter being connected to the lower wiring layer 34 through the via hole. In other words, there are formed the first upper wiring layer 52a, which is connected to the upper TiN electrode layer 48 of the capacitive element 50, and the second upper wiring layer 52b, which is connected to the lower TiN electrode layer 44 of the capacitive electrode 50 through the lower wiring layer 34. Thus, the capacitive element 50 of MIMC structure is completed. See FIG. 8.

It is to be noted in FIG. 8 that the TiN/$Ta_2O_5$/TiN laminate film 42 remains between the second upper wiring layer 52b and the second interlayer insulating film 40 thereunder. As in the case of forming the lower wiring layer 34 mentioned above, it is possible as a matter of course to from wiring layers for connection to other elements in the region other than the capacitive element forming region A at the time when the first and second upper wiring layers 46a and 46b are formed.

An overcoat film (not shown) is formed over the entire surface of the substrate, and openings for pads are made at prescribed positions. In this way there is finally completed the semiconductor integrated circuit in which the capacitive element 50 of MIMC structure, the PN photodiode 36, and the vertical NPN bipolar transistor 38 are mounted all together on the same p-type semiconductor substrate 10.

As mentioned above, this embodiment provides a semiconductor device in which the capacitive element 50 of MIMC structure, the PN photodiode 36, and the vertical NPN bipolar transistor 38 are mounted all together on the same p-type semiconductor substrate 10. In this semiconductor device, the lower wiring layer 34 connected to the lowermost TiN electrode layer 44 of the capacitive element 50 of MIMC structure is formed on the insulating film 22a and the first interlayer insulating film 32, and the $p^-$-type low-concentration semiconductor layer 14a (which is about 10 μm thick and has an impurity concentration of about $2\times10^{14}$ $cm^{-3}$ which is lower than that of the p-type semiconductor substrate 10) is interposed between the insulating film 22a and the p-type semiconductor substrate 10. This construction suppresses the parasitic capacity of the capacitive element 50 of MIMC structure Thus, this embodiment makes it possible to realize the high-performance integrated circuit in which the capacitive element 50 of MIMC structure with a low parasitic capacity, the photodiode 36, and the bipolar transistor 38 are mounted all together.

According to this embodiment, the $p^-$-type epitaxial layer 14 (which is about 10 μm thick and has an impurity concentration of about $2\times10^{14}$ $cm^{-3}$ which is lower than that ($1\times10^{15}$ $cm^{-3}$) of the p-type semiconductor substrate 10) is formed on the p-type semiconductor substrate 10 and the $p^+$-type semiconductor region 12. From this $p^-$-type epitaxial layer 14 are formed simultaneously the $p^-$-type low-concentration semiconductor layer 14a in the capacitive element 50 of MIMC structure and the $p^-$-type anode layer 14b of the PN photodiode 36. On the $p^-$-type epitaxial layer 14 and the semiconductor layer 16 for p-type substrate is formed the n-type epitaxial layer 20, and from this n-type epitaxial layer 20 are formed simultaneously the n-type cathode layer 20b of the ph photodiode 36 and the n-type collector layer 20c of the vertical NPN bipolar transistor 38. In this way it is possible to carry out in common the steps for fabricating the semiconductor device in which the capacitive element 50 of MIMC structure, the photodiode 36, and the vertical bipolar transistor 38 are mounted all together. This contributes to cost reduction.

According to this embodiment, the n-type epitaxial layer 20 is selectively oxidized by LOCOS method, so as to form the element isolating part (field part) for the photodiode forming region B and the bipolar transistor forming region C and to form the field oxide film 22 and the insulating film 22a in the capacitive forming region A. In this way the insulating film 22a necessary for the capacitive element 50 of MIMC structure and the field oxide film 22 of the element isolating part are formed simultaneously by selective oxidation of the n-type epitaxial layer 20. Thus, it is possible to carry out in common the steps for fabricating the semiconductor device in which the capacitive element 50 of MIMC structure, the photodiode 36, and the vertical bipolar transistor 38 are mounted all together. This contributes to cost reduction.

According to this embodiment, the semiconductor layer 16 for p-type substrate whose impurity concentration in the vicinity of the surface is as low as about $1\times10^{15}$ $cm^{-3}$ is formed by selectively adding a p-type impurity (such as boron) to the $p^-$-type epitaxial layer 14. In this way, the impurity concentration in the vicinity of the surface of the semiconductor layer 16 for p-type substrate is made to match with the concentration in the substrate necessary for the vertical NPN bipolar transistor 38, and they have the matching characteristics. Therefore, the vertical NPN bipolar transistor has the desired characteristic properties. Thus, this embodiment makes it possible to easily fabricate the multi-functional high-performance integrated circuit in which the capacitive element 50 of MIMC structure with a low parasitic capacity, the PN photodiode 36, and the vertical NPN bipolar transistor 38 are mounted all together.

The foregoing embodiment is concerned with the semiconductor device in which the capacitive element 50 of MIMC structure, the PN photodiode 36, and the vertical bipolar transistor 38 are mounted all together. The scope of the present invention is not limited to this combination of elements. For example, the present invention may be applied to a semiconductor device and a process for fabrication thereof, in which the vertical NPN bipolar transistor 38 is replaced by a CMOS transistor.

Figure 9:
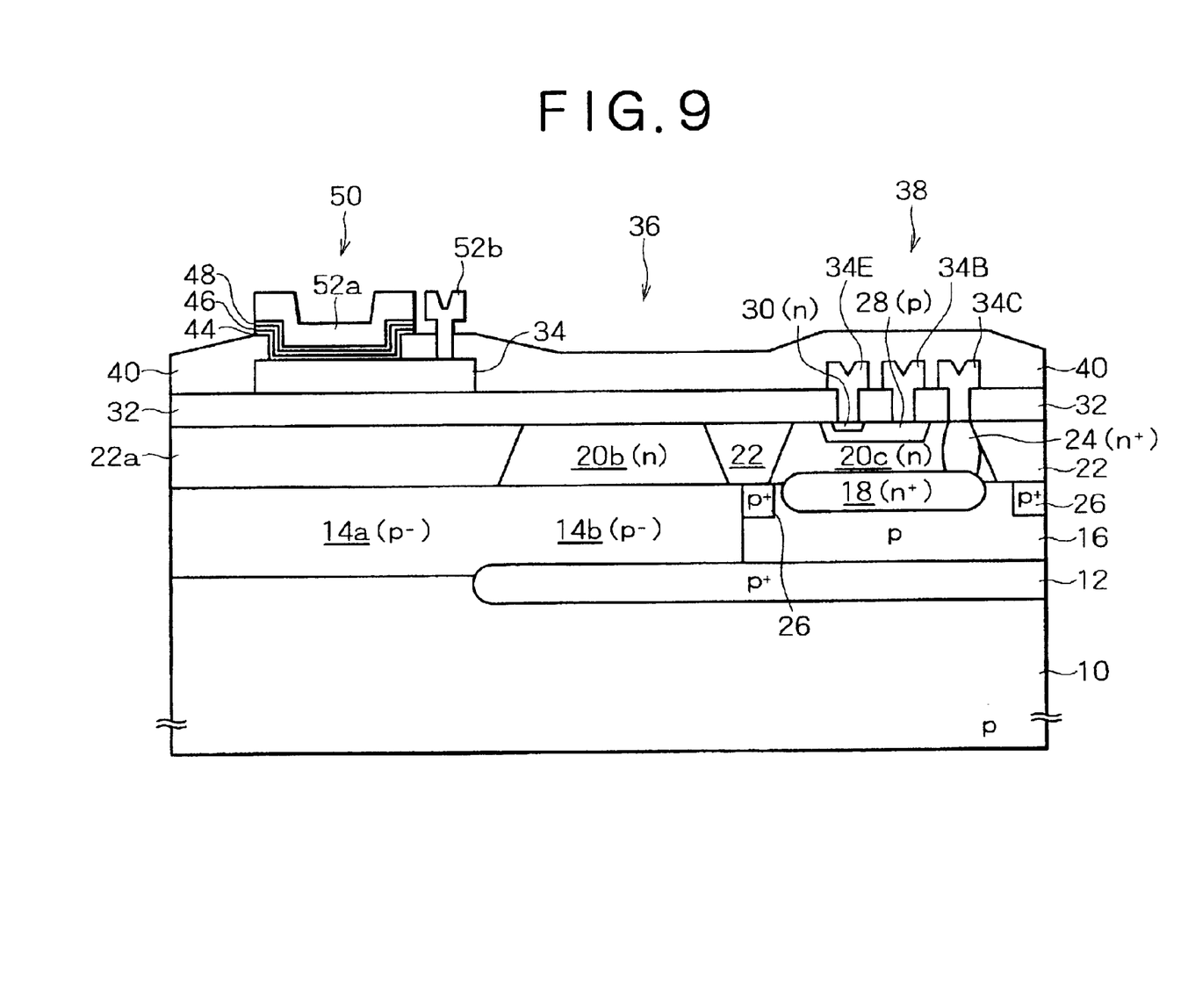
FIG. 9 is a schematic sectional view of a semiconductor device pertaining to the first modified embodiment of the present invention, said semiconductor device having a capacitive element of MIMC structure, a PN photodiode, and a vertical NPN bipolar transistor which are mounted on the same semiconductor substrate.

An explanation is made below of a first modified embodiment of the present invention. The first modified embodiment of the present invention is concerned with a semiconductor device in which a capacitive element of MIMC structure, a PN photodiode, and a vertical NPN bipolar transistor are mounted on the same semiconductor substrate, as shown in FIG. 9. This semiconductor device is quite similar in construction to that shown in FIG. 1 above. It differs in that the TiN/Ta$_2$O$_5$/TiN laminate film 42 does not remain between the second upper wiring layer 52b and the second interlayer insulating film 40 thereunder in the capacitive element 50 of MIMC structure.

The semiconductor device shown in FIG. 9 is fabricated by the following process. First, the steps shown in FIGS. 2 to 7 are carried out. Then, as in the above-mentioned embodiment, a silicon oxide film is deposited over the entire surface of the substrate. It is planarized to form the second interlayer insulating film 40. Selective etching is performed on the second interlayer insulating film 40 on the lower wiring layer 34, so as to form an opening through which the surface of the lower wiring layer 34 is exposed. On the entire surface of the substrate is formed a TiN/Ta$_2$O$_5$/TiN laminate film by sequentially depositing a TiN layer (which becomes the lower electrode layer later), a Ta$_2$O$_5$ layer (which becomes the dielectric layer), and a TiN layer (which becomes the upper electrode layer).

The TiN/Ta$_2$O$_5$/TiN laminate film is selectively patterned by photolithography and dry etching, so as to form the capacitive element 50 of MIMC structure which consists of the TiN lower electrode layer 44 connected to the lower wiring layer 34, the Ta$_2$O$_5$ dielectric layer 46 on the TiN lower electrode layer 44, and the TiN upper electrode layer 48 on the Ta$_2$O$_5$ dielectric layer 46. At the same time, that part of the TiN/Ta$_2$O$_5$/TiN laminate film which does not constitute the capacitive element 50 of MIMC structure is etched out.

The second interlayer insulating layer 40 is selectively removed by etching so as to form a via hole reaching the top of the lower wiring layer 34. The via hole is filled by depositing a metal layer composed mainly of aluminum alloy. The metal layer composed mainly of aluminum alloy is selectively patterned by photolithography and RIE, so as to form the first upper wiring layer 52a connected to the TiN upper electrode layer 48 of the capacitive element 50 of MIMC structure and the upper wiring layer 52b connected to the lower wiring layer 34 through the via hole.

In other words, the first upper wiring layer 52a connected to the TiN upper electrode layer 48 of the capacitive element 50 of MIMC structure is formed and the upper wiring layer 52b connected to the lower wiring layer 34 through the via hole is formed. Thus, the capacitive element 50 of MIMC structure is completed.

According to the first modified embodiment mentioned above, the TiN/Ta$_2$O$_5$/TiN laminate film 42 does not remain between the second upper wiring layer 52b and the second interlayer insulating film 40 thereunder in the capacitive element 50 of MIMC structure. Therefore, this embodiment produces not only the same effect as in the above-mentioned embodiment but also the effect of reducing the wiring step of the second upper wiring layer 52b.

Figure 10:
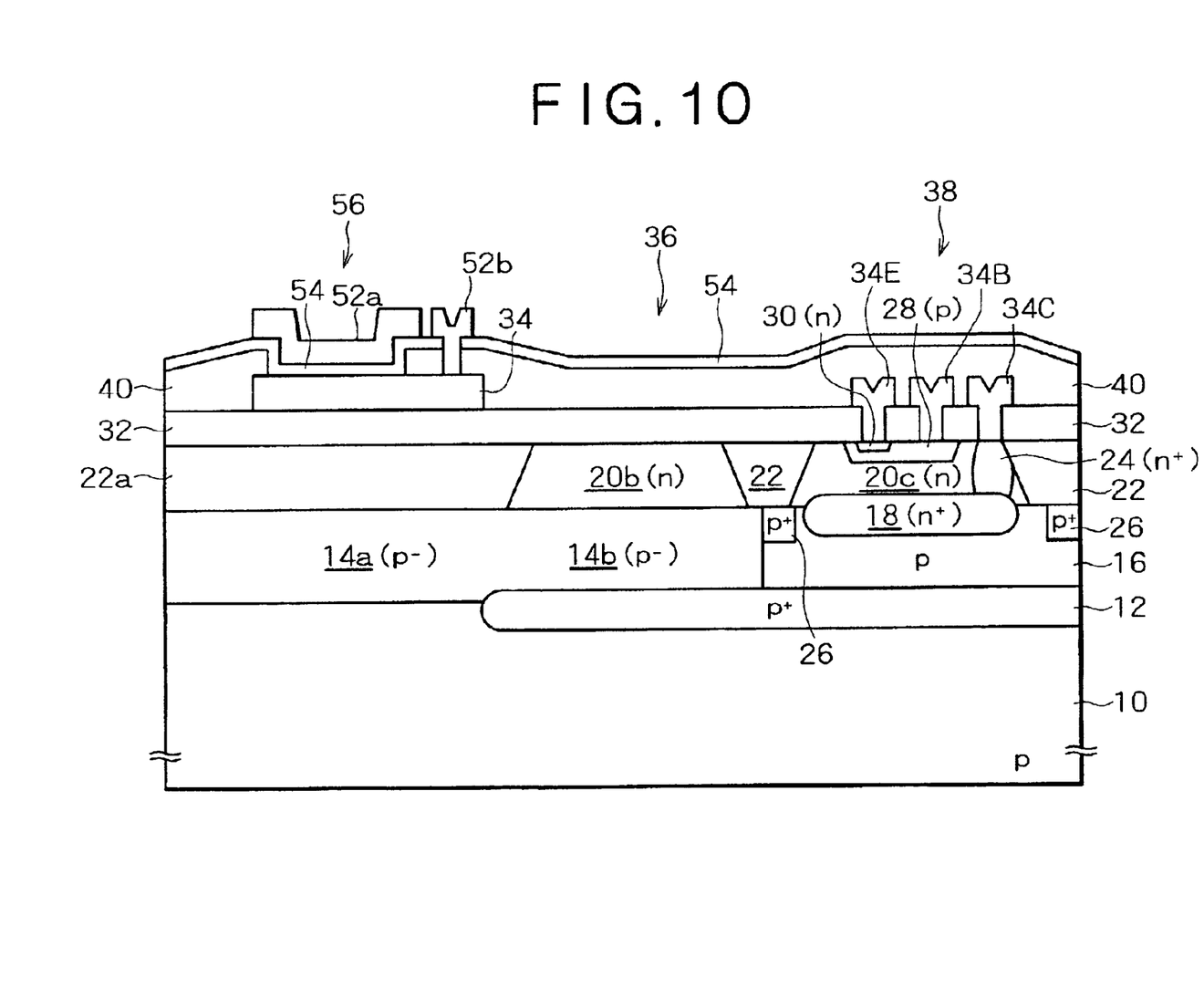
FIG. 10 is a schematic sectional view of a semiconductor device pertaining to the second modified embodiment of the present invention, said semiconductor device having a capacitive element of MIMC structure, a PN photodiode, and a vertical NPN bipolar transistor which are mounted on the same semiconductor substrate.

The second modified embodiment of the present invention is concerned with a semiconductor device in which a capacitive element of MIMC structure, a PN photodiode, and a vertical NPN bipolar transistor are mounted on the same semiconductor substrate, as shown in FIG. 10.

The semiconductor device has the capacitive element 56 of MIMC structure in place of the capacitive element 50 of MIMC structure shown in FIG. 1. (The capacitive element 50 of MIMC structure consists of the TiN upper electrode layer 44 and the TiN lower electrode layer 48, with the Ta$_2$O$_5$ dielectric layer 46 interposed between them). The capacitive element 56 of MIMC structure consists of the first upper wiring layer 52a (as the upper electrode layer), the lower wiring layer 34 (as the lower electrode layer), and the SiN dielectric layer 54 (as the dielectric layer).

The semiconductor device shown in FIG. 10 is fabricated by the following process. First, the steps shown in FIGS. 2 to 7 are carried out. Then, a silicon oxide film is deposited over the entire surface of the substrate. It is planarized to form the second interlayer insulating film 40. Selective etching is performed on the second interlayer insulating film 40 on the lower wiring layer 34, so as to form an opening through which the surface of the lower wiring layer 34 is exposed. On the entire surface of the substrate is formed the SiN dielectric layer 54 as a dielectric layer.

The SiN dielectric layer 54 and the second interlayer insulating film 40 are selectively removed by photolithography and dry etching, so as to make a via hole reaching the top of the lower wiring layer 34. The via hole is filled by depositing a metal film composed mainly of aluminum alloy. The metal layer composed mainly of aluminum alloy is selectively patterned by photolithography and RIE, so as to form the first upper wiring layer 52a on the lower wiring layer 34, with the SiN dielectric layer 54 interposed between them, and to form the upper wiring layer 52b connected to the lower wiring layer 34 through the via hole.

In this way there is formed the capacitive element 56 of MIMC structure which has the first upper wiring layer 52a (as the upper electrode layer), the lower wiring layer 34 (as the lower electrode layer), and the SiN dielectric layer 54 (as the dielectric layer) which is held between the first upper wiring layer 52a and the lower wiring layer 34.

According to the second modified embodiment, it is unnecessary to form and fabricate the TiN/Ta$_2$O$_5$/TiN laminate film 42 in the original embodiment. Therefore, it is possible to simplify the fabrication process.

Although the above-mentioned embodiment and the first modified embodiment employ the Ta$_2$O$_5$ dielectric layer 46 for the capacitive element 50 of MIMC structure, this Ta$_2$O$_5$ dielectric layer 46 may be replaced by the SiN dielectric layer used in the capacitive element 56 of MIMC structure with which the second modified embodiment is concerned.

As explained in detail above, the following effects are produced by the semiconductor device and the process for fabrication thereof according to the present invention.

The semiconductor device according to the first aspect is characterized in that the low-concentration semiconductor layer is interposed between the upper electrode layer and the insulating layer in the capacitive element of MIMC structure in which the lower electrode layer, the dielectric layer, and the upper electrode layer are sequentially laminated on the insulating film. This construction suppresses the parasitic capacity of the capacitive element of MIMC structure.

Therefore, it is possible to realize a high-performance capacitive element with a low parasitic capacity.

The semiconductor device according to the second aspect is characterized in that the low-concentration semiconductor layer is interposed between the semiconductor substrate and the lower insulating film of the capacitive element of MIMC structure in the case where the capacitive element of MIMC structure an d the photodiode are mounted together. This construction suppresses the parasitic capacity of the capacitive element of MIMC structure, as in the case of the first aspect. Therefore, it is possible to realize a multi-functional high-performance integrated circuit in which a capacitive element with a low parasitic capacity and a photodiode are mounted together.

In addition, the low-concentration semiconductor layer under the capacitive element of MIMC structure and the semiconductor layer which becomes either the anode or cathode of the photodiode are formed from the semiconductor layer of prescribed conductivity type formed on the semiconductor substrate. Therefore, this construction permits the steps to be carried out in common for fabrication of the semiconductor device in which the capacitive element and the photodiode are mounted together. This leads to cost reduction.

The semiconductor device according to the third aspect is characterized in that the low-concentration semiconductor layer is interposed between the semiconductor substrate and the lower insulating film of the capacitive element of MIMC structure in the case where the capacitive element of MIMC structure, the photodiode, and the bipolar transistor are mounted together. This construction suppresses the parasitic capacity of the capacitive element of MIMC structure, as in the case of the first aspect. Therefore, it is possible to realize a multi-functional high-performance integrated circuit in which a capacitive element with a low parasitic capacity, a photodiode, and a bipolar transistor are mounted together.

In addition, the low-concentration semiconductor layer under the capacitive element of MIMC structure, the semiconductor layer which becomes either the anode or cathode of the photodiode, and the semiconductor layer for substrate of the bipolar transistor are formed from the semiconductor layer of prescribed conductivity type formed on the semiconductor substrate, and the semiconductor layer which becomes either the anode or cathode of the photodiode and the collector layer of the bipolar transistor are formed from the semiconductor layer of opposite conductivity type formed on the semiconductor layer of prescribed conductivity type. Therefore, this construction permits the steps to be carried out in common for fabrication of the semiconductor device in which the capacitive element, the photodiode, and the bipolar transistor are mounted together. This leads to cost reduction.

The process for fabrication of a semiconductor device according to the ninth aspect consists of forming on the semiconductor substrate the semiconductor layer having a lower impurity concentration than the semiconductor substrate, forming the insulating film on the semiconductor layer, and forming on the semiconductor layer the capacitive element by sequentially laminating a lower electrode layer, a dielectric layer, and an upper electrode layer. In other words, when the capacitive element of MIMC structure is formed, the semiconductor layer of prescribed conductivity type having a lower impurity concentration than the semiconductor substrate is formed between the semiconductor substrate and the insulating film thereunder. This construction suppresses the parasitic capacity of the capacitive element of MIMC structure. Therefore, it is possible to easily form a high-performance capacitive element with a low parasitic capacity.

The process for fabrication of a semiconductor device according to the tenth aspect consists of forming on the semiconductor substrate the semiconductor layer of a first conductivity type having a lower impurity concentration than the semiconductor substrate, and performing selective oxidation on the semiconductor layer of a second conductivity formed on the semiconductor layer of a first conductivity type, and forming on the insulating film the capacitive element by sequentially laminating a lower electrode layer, a dielectric layer, and an upper electrode layer. In other words, when the capacitive element of MIMC structure is formed, the low-concentration semiconductor layer is formed between the semiconductor substrate and the insulating film thereunder. This construction suppresses the parasitic capacity of the capacitive element of MIMC structure as in the case of the ninth aspect mentioned above. Therefore, it is possible to easily form a multi-functional high-performance integrated circuit in which a capacitive element with a low parasitic capacity and a photodiode are mounted together.

In addition, the low-concentration semiconductor layer under the capacitive element of MIMC structure and the semiconductor layer which becomes either the anode or cathode of the photodiode are formed simultaneously by formation of the semiconductor layer of a first conductivity type on the semiconductor substrate. This construction permits the steps to be carried out in common for fabrication of the semiconductor device in which the capacitive element and the photodiode are mounted together. This leads to cost reduction.

The process for fabrication of a semiconductor device according to the eleventh aspect consists of forming on the semiconductor substrate the semiconductor layer of a first conductivity type having a lower impurity concentration than the semiconductor substrate, thereby forming the low-concentration semiconductor layer, performing selective oxidation on the semiconductor layer of a second conductivity formed on the semiconductor layer of a first conductivity type, and forming on the insulating film the capacitive element by sequentially laminating a lower electrode layer, a dielectric layer, and an upper electrode layer. This construction suppresses the parasitic capacity of the capacitive element of MIMC structure as in the case of the ninth aspect mentioned above. Therefore, it is possible to easily form a multi-functional high-performance integrated circuit in which a capacitive element with a low parasitic capacity, a photodiode, and a bipolar transistor are mounted together.

In addition, the low-concentration semiconductor layer under the capacitive element of MIMC structure, the semiconductor layer which becomes either the anode or cathode of the photodiode, and the semiconductor layer for substrate of the bipolar transistor are formed simultaneously by formation of the semiconductor layer of a first conductivity type on the semiconductor substrate, and the semiconductor layer which becomes either the anode or cathode of the photodiode and the collector layer of the bipolar transistor are formed simultaneously by formation of the semiconductor layer of a second conductivity type on the semiconductor layer of a first conductivity type. This construction permits the steps to be carried out in common for fabrication of the semiconductor device in which the capacitive element, the photodiode, and the bipolar transistor are mounted together. This leads to cost reduction.

The process for fabrication of a semiconductor device according to the twelfth aspect is a modification of the process according to the tenth or eleventh aspect mentioned above. The modification is characterized in that when the insulating film is formed on the semiconductor layer of a first conductivity type by selective oxidation of the semiconductor layer of a second conductivity type in the capacitive element forming region, the field oxide film is formed by performing selective oxidation simultaneously on the semiconductor layer of a second conductivity type in the element isolating part. In other words, the insulating film under the capacitive element of MIMC structure and the field oxide film in the element isolating part are formed simultaneously by selective oxidation. This construction permits the steps to be carried out in common for fabrication of the semiconductor device in which the capacitive element etc. are mounted together. This leads to further cost reduction.

The process for fabrication of a semiconductor device according to the thirteenth aspect is concerned with a modification of the process according to the eleventh aspect mentioned above. The modification is characterized in that the low-concentration layer is formed on the semiconductor substrate, and the low-concentration semiconductor layer is formed in the capacitive element forming region and the semiconductor layer for substrate is formed in the bipolar transistor forming region, and then an impurity of prescribed conductivity type is incorporated into the semiconductor layer for substrate. In this way it is possible to control the impurity concentration in the semiconductor layer for substrate which functions as the substrate of the bipolar transistor, for matching with the impurity concentration of the substrate required to realize the desired characteristics. Thus, the bipolar transistor having the desired characteristics is realized. It is possible to easily form a multi-functional high-performance integrated circuit in which a capacitive element with a low parasitic capacity and a bipolar transistor with desired characteristics are mounted together.

While the preferred embodiments of the present invention have been described using the specific terms, such description is for illustrative purposes only, and it is to be understood that changes and variations may be made without departing from the spirit or scope of the following claims.

What is claimed is:

1. A semiconductor device having a capacitive element and a photodiode mounted together on a same semiconductor substrate, the semiconductor device comprising:

a first semiconductor layer of a same conductivity type as semiconductor substrate and having a lower impurity concentration than the semiconductor substrate formed on the semiconductor substrate, the first semiconductor layer formed as a common layer in a capacitive element forming region and a photodiode forming region, a first portion of the first semiconductor layer formed in the capacitive element forming region and a second portion of the first semiconductor layer formed in the photodiode forming region, the second portion being one of an anode and a cathode;

the capacitive element having a lower electrode layer, a dielectric layer, and an upper electrode layer, which are sequentially laminated on the first portion of the first semiconductor layer, with an insulating film interposed between the capacitive element and first portion of the first semiconductor layer;

a second semiconductor layer having a conductivity type opposite to the first semiconductor layer formed on the second portion of the first semiconductor layer and being one of an anode and a cathode opposite the second portion of the first semiconductor layer; and a third semiconductor layer having a same conductivity type as the semiconductor substrate and a higher impurity concentration than the semiconductor substrate formed between the semiconductor substrate and the first semiconductor layer, the third semiconductor layer formed in the photodiode forming region and not formed in the capacitive element forming region.

2. A semiconductor device in which a capacitive element, a photodiode, and a bipolar transistor are mounted on a same semiconductor substrate, the semiconductor device comprising:

a first semiconductor layer of a same conductivity type as semiconductor substrate and having a lower impurity concentration than the substrate is formed on the substrate, the first semiconductor layer formed as a common layer in a capacitive element forming region and a photodiode forming region, a first portion of the first semiconductor layer formed in the capacitive element forming region, a second portion of the first semiconductor layer formed in the photodiode forming region, and a third portion of the first semiconductor layer formed in a bipolar transistor forming region, the second portion being one of an anode and a cathode, the first portion and the second portion being formed as a common continuous layer;

the capacitive element having a lower electrode layer, a dielectric layer, and an upper electrode layer, which are sequentially laminated, is formed on the first portion of the first semiconductor layer low, with an insulating film interposed between the capacitive element and the first portion of the first semiconductor layer;

a second semiconductor layer having a conductivity type opposite to the first semiconductor layer formed on the second portion of the first semiconductor layer and being one of an anode and a cathode opposite the second portion of the first semiconductor layer; and a third semiconductor layer having a same conductivity type as the semiconductor substrate and a higher impurity concentration than the semiconductor substrate formed between the semiconductor substrate and the first semiconductor layer, the third semiconductor layer formed in the photodiode forming region and the bipolar transistor formed region and not formed in the capacitive element forming region.

3. A semiconductor device in accordance with any of claims 1 or 2, wherein the lower electrode layer of the capacitive element comprises TiN.

4. A semiconductor device in accordance with any of claims 1 or 2, wherein the dielectric layer of the capacitive element comprises $Ta_2O_5$.

5. A semiconductor device in accordance with any of claims 1 or 2, wherein the upper electrode layer of the capacitive element comprises TiN.

6. A semiconductor device in accordance with any of claims 1 or 2, wherein the first semiconductor layer has an impurity concentration no lower than $1 \times 10^{13}$ cm$^{-3}$ and no higher than $5 \times 10^{14}$ cm$^{-3}$.

7. A semiconductor device in accordance with any of claims 1 or 2, wherein the first semiconductor layer has an impurity concentration no lower an $1 \times 10^{13}$ cm$^{-3}$ and no higher than $5 \times 10^{14}$ cm$^{-3}$, and the second semiconductor layer as an impurity concentration no lower than $1 \times 10^{15}$ cm$^{-3}$ and no higher than $5 \times 10^{16}$ cm$^{-3}$.

* * * * *